United States Patent [19]

Stirn

[11] 4,370,510

[45] Jan. 25, 1983

[54] GALLIUM ARSENIDE SINGLE CRYSTAL SOLAR CELL STRUCTURE AND METHOD OF MAKING

[75] Inventor: Richard J. Stirn, Pomona, Calif.

[73] Assignee: California Institute of Technology, Pasadena, Calif.

[21] Appl. No.: 191,008

[22] Filed: Sep. 26, 1980

[51] Int. Cl.$^3$ .................. H01L 31/06; H01L 31/18
[52] U.S. Cl. ............................ 136/262; 29/572; 136/261; 148/1.5; 148/175; 357/30
[58] Field of Search .............. 148/175, 1.5; 136/261, 136/262; 357/30; 29/572

[56] References Cited

U.S. PATENT DOCUMENTS

| | | | |
|---|---|---|---|
| 3,935,040 | 1/1976 | Mason | 148/175 |
| 3,993,533 | 11/1976 | Milnes et al. | 156/613 |
| 4,227,941 | 10/1980 | Bozler et al. | 136/255 |

OTHER PUBLICATIONS

J. C. C. Fan et al., "GaAs Shallow–Homojunction Solar Cells", Conf. Record, 14th IEEE Photovoltaic Specialists Conf. (1980), pp. 1102–1105.

Y. C. M. Yeh et al., "Epitaxial & Polycrystalline GaAs Solar Cells Using OM-CVD Techniques", Conf. Record, 14th IEEE Photovoltaic Specialists Conf. (1980), pp. 1338–1342.

R. J. Stirn et al., "Single Crystal & Polycrystalline GaAs Solar Cells Using AMOS Technology", Conf. Record, 12th IEEE Photovoltaic Specialists Conf. (1976), pp. 883–892.

A. R. Kirkpatrick et al., "A Nonconventional Approach To Thin Film Fabrication", Conf. Record, 13th IEEE Photovoltaic Specialists Conf. (1978), pp. 1342–1346.

Primary Examiner—Aaron Weisstuch
Attorney, Agent, or Firm—Freilich, Hornbaker, Wasserman, Rosen & Fernandez

[57] ABSTRACT

A production method and structure for a thin-film GaAs crystal for a solar cell on a single-crystal silicon substrate (10) comprising the steps of growing a single-crystal interlayer (12) of material having a closer match in lattice and thermal expansion with single-crystal GaAs than the single-crystal silicon of the substrate, and epitaxially growing a single-crystal film (14) on the interlayer. The material of the interlayer may be germanium or graded germanium-silicon alloy, with low germanium content at the silicon substrate interface, and high germanium content at the upper surface. The surface of the interface layer (12) is annealed for recrystallization by a pulsed beam of energy (laser or electron) prior to growing the interlayer. The solar cell structure may be grown as a single-crystal n+/p shallow homojunction film or as a p/n or n/p junction film. A Ga(Al)As heteroface film may be grown over the GaAs film.

8 Claims, 2 Drawing Figures

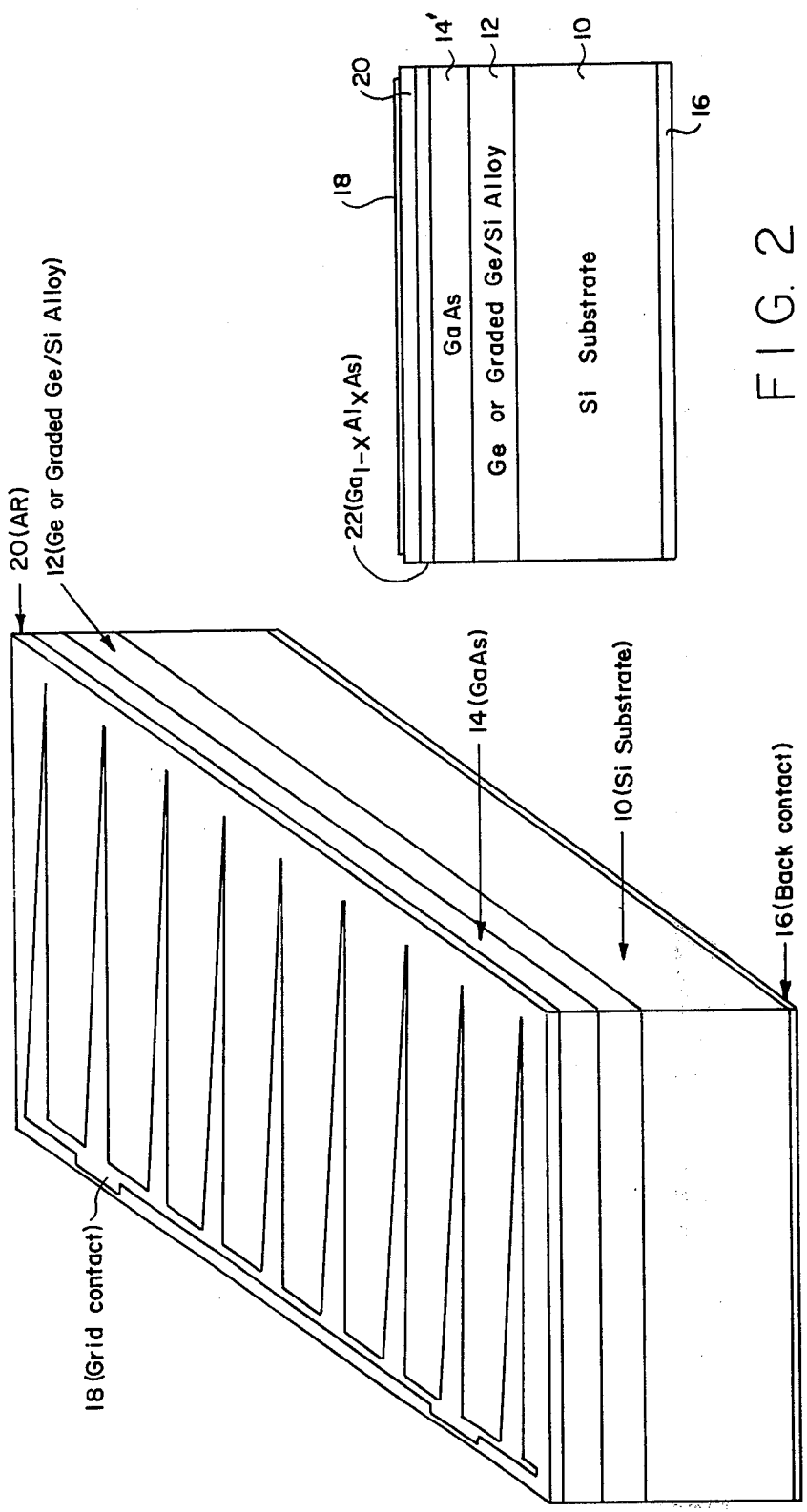

GALLIUM ARSENIDE SINGLE CRYSTAL SOLAR CELL STRUCTURE AND METHOD OF MAKING

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

TECHNICAL FIELD

This invention relates to solar cells and a method of making solar cells, and more particularly to solar cells of the GaAs single-crystal type.

BACKGROUND OF THE INVENTION

Solar cells are ideal electric energy generators, except in respect to initial installation cost, because during operation they consume no energy from terrestrial sources, such as fossil fuel or nuclear fuels, and therefore do not produce any pollution or create any undue hazard to public health and safety. Unfortunately, the present cost of producing solar cells and their low efficiency rating, makes solar electric energy too costly for use in any but the most exceptional cases, such as at remote microwave repeater stations or off-shore oil platforms. The current objective is to reduce the cost of solar electric energy to less than 70 cents per peak watt.

To reduce the solar electric energy cost, both conversion efficiency and cell fabrication costs may be improved, but neither should be improved at the expense of the other since the net gain may well be nil. Because research and development in this field is expensive, it is desirable to conduct research on a type of solar cell that will provide promise of improved cost and improved conversion efficiency as well. Of the known types of solar cells, GaAs single-crystal cells have the greatest potential for efficiency. The oldest type are Si single-crystal cells, but the production of large-area Si crystals continues to be a major problem with possible solutions that are too costly. Polycrystalline CdS cells are more promising in terms of cost, but reportedly have an efficiency of only 9%, and have stability problems. Research in amorphous silicon cells may eventually reduce production cost, but reported efficiency is only 5.5%, lower than for polycrystalline CdS. Polycrystalline GaAs cells may prove to be more efficient, but efficiencies that have been reported are about 8%. There is thus a need to develop a solar cell structure, and method of producing the structure, for high efficiency (about 18% or greater) and low cost.

The use of GaAs as the semiconductor material is widely recognized for obtaining high efficiencies on thin-film solar cells. This is partially due to its high light absorption and better match to the solar spectrum. Also, high efficiencies are to be expected because the barriers used in GaAs, such as n/p homojunctions, are reasonably stable at normal operating temperatures and do not have the problems of many heterojunctions. Such heterojunction problems, except for the InP/CdS configuration, arise from lattice parameter and electron affinity mismatch between the two components. These in turn can cause high interface recombination state densities and unwanted barriers in the conduction bands, respectively, leaading to reduced open-circuit voltages ($V_{oc}$) and fill factors.

OBJECTS AND SUMMARY OF THE INVENTION

An object of this invention is to provide high-efficiency (about 18% or greater) thin-film GaAs solar cells on low-cost substrate material. A further object is to provide a structure and method for producing thin-film GaAs solar cells on a silicon substrate.

These and other objects of the invention are achieved by chemical vapor deposition of a thin-film gallium arsenide (GaAs) solar cell structure on a low-cost single-crystal substrate prepared with a thin interlayer of single-crystal material having a closer match in lattice parameter and thermal expansion with the GaAs crystal than does silicon. One exemplar of the invention is comprised of a doped silicon (Si) substrate prepared with a thin film of single-crystal germanium (Ge), or a graded silicon-germanium alloy (Si/Ge) having a low Ge content at the Si interface and a high Ge content at the surface where the GaAs film is exptaxially grown. Surface recrystallization prior to the GaAs growth, and possibly again after the GaAs growth, will reduce the number of dislocations caused by lattice misfit and thermal expansion differences, thereby to improve the electronic properties of the solar cell for greater efficiencies. The recrystallization process is best accomplished by the use of pulsed electron or laser beams of very short duration such that only the top is rapidly melted and resolidified to just a micrometer depth. Pulsing the recrystallization energy for such a shallow melt allows the recrystallization velocity to be much larger than the dislocation climb velocity so that the free surface region will be free of dislocations after such pulse annealing. The GaAs layer is epitaxially grown as either a shallow n+/p homojunction of about 4 micrometers thickness or as a p/n junction with a Ga(Al)As heteroface of about 0.05 to 0.1 micrometer thickness deposited over the GaAs film. Subsequent processing of the structure into a solar cell follows using standard methods of metallization of a contact on the back (substrate) side and a grid contact on the obverse side. An antireflection coating is added to the metallized obverse side.

BRIEF DESCRIPTION OF THE DRAWINGS

FIG. 1 is an isometric view of an exemplar GaAs solar cell structure on a low-cost single-crystal silicon substrate with a Ge or graded Si/Ge alloy interlayer.

FIG. 2 is an end view of an alternative exemplar GaAs solar cell structure on a low-cost single-crystal silicon substrate.

DESCRIPTION OF PREFERRED EMBODIMENTS

Referring to FIG. 1, the structure of an exemplar for a solar cell is comprised of a single-crystal silicon substrate 10 with thickness of approximately 50 to 250 micrometers and an interlayer 12 of germanium, or graded silicon-germanium alloy with a low germanium content at the interface between the substrate and interlayer, and a high germanium content at the upper surface. A thin layer 14 (about 4 micrometers) of GaAs is chemical vapor deposited (CVD) on the interlayer with suitable dopants for growth of single-crystal GaAs with a shallow n+/p homojunction. A back contact 16 and an obverse grid contact 18 is electroplated to complete the solar cell. An antireflection coating 20, such as silicon nitride, is deposited on the obverse side.

An alternative solar cell embodying the present invention is shown in FIG. 2. For convenience, the same reference numerals are applied to the same parts of the structure as in the corresponding structure of FIG. 1. The differences, thus made more evident, are a GaAs film 14' having a p/n or n/p junction, rather than an $n^+/p$ shallow junction, and the addition of a Ga(Al)As heteroface layer 22 of about 0.25 to 0.1 micrometers thickness. The heteroface provides reduced surface recombination for higher conversion efficiency than is otherwise possible from a grown GaAs junction. Thus, the heteroface functions as a window for efficient transmission of solar radiation into the cell. An antireflection coating 20 is applied as before.

In both exemplars of the invention, GaAs is selected as the material for the solar cell because of the higher conversion efficiency possible (18 to 22%, compared to about 12 to 17% for Si solar cells). This would result in a smaller overall area of the solar array for the same output power. To reduce the mass and cost, the GaAs is selected to be an epitaxial thin film that is vapor deposited because films can be grown much thinner (about 4 micrometers) by vapor deposition than can be cut from a GaAs crystal grown in any other manner. The substrate for the CVD film is selected to be low-cost silicon because it has about half the density of GaAs, so that the mass of the solar cell is significantly reduced, which is important for space applications. The problem is to achieve single crystallinity in the GaAs growth by vapor deposition on single-crystal Si substrate. The solution, in accordance with this invention, is to use a Ge or graded Si/Ge interlayer fabricated, for example, by chemical vapor deposition (CVD), using the appropriate gases for providing the Ge, or graded Si/Ge, growth, namely germane or germane ($GeH_4$) and silane ($SiH_4$) in helium (He) or hydrogen ($H_2$). Although the usual carrier gas used in CVD systems is hydrogen, the carrier gas is preferably helium in order to allow epitaxial growth of Ge and Si at lower temperatures than possible with $H_2$. This may be significant because of the differences of about 70% in the Ge and Si thermal expansion coefficients.

There is also a mismatch in lattice constant between Si and Ge of about 4%. For that reason it is preferable to deposit a graded composition interlayer of Si/Ge alloy, with low Ge content in the initial epitaxial growth at the Si substrate interface increasing to a high Ge content as the interlayer is grown. Such a variation in the Ge and Si content of the graded interlayer may be linear or preferably incremental, i.e., in steps. In the case of varying the composition in steps, the optimum number of steps for a given thickness of the interlayer can be determined empirically. In either case, the Si/Ge interlayer will reduce the number of misfit dislocations at the interface, but not entirely. So with either a Ge or graded Ge/Si interlayer, dislocations caused by lattice misfit and thermal expansion differences will remain to cause the subsequently grown GaAs to have degraded electronic properties, resulting in a lower solar cell efficiency than if a single-crystal Ge or a GaAs substrate were used. Therefore, a surface recrystallization step is performed prior to CVD growth of the GaAs film, and another, perhaps, after the GaAs is deposited.

The recrystallization process is best accomplished by the use of pulsed electron or laser beams. The pulsed energy will have a very short duration, on the order of 10 to 100 nanoseconds, so that the Ge material within the top one micrometer depth or so is rapidly melted and resolidified. If the recrystallization velocity is much larger than the dislocation climb velocity, the near-surface region of the Ge should be free of dislocations after such pulse annealing, thus providing a high-quality surface upon which GaAs can be grown epitaxially.

The GaAs growth is best accomplished by pyrolytic decomposition of trimethyl gallium (TMG) in the presence of arsine ($AsH_3$) with suitable gaseous sources for dopant incorporation. This method, generally known as organometallic chemical vapor deposition (OM-CVD), offers the best potential and advantages for large-scale production, lowest possible growth temperature, and lack of halide etching during growth. This is particularly so for operating in the low-pressure regime, and perhaps with glow-discharge enhancement. Subsequent processing of the GaAs layers into solar cells can follow using standard methods for metallization and antireflection coatings.

Because of the mismatch in thermal expansion coefficient between the GaAs layer and Si substrate, there will be a curling effect when a 50-micrometer thick substrate is used, as is desirable for the lightest possible cell structure. The degree of curl will depend on the graded Si/Ge interlayer thickness. The tendency to curl could be minimized by using 50-micrometer substrates which have a thicker (about 250 micrometers) border. Such a border will simplify handling and reduce breakage during processing. Alternatively, the curling problem may be avoided by bonding a cover glass on the obverse side (for radiation protection) before thinning the Si substrate.

Process techniques for the various layers will now be described in the order in which they are applied, following selection of the silicon substrate, which may be from any of the commercially available sources. Some possibilities are single-crystal Si sheet, such as dendritic web, cast Si sheet made by the heat exchanger method, or Si wafers sawed from ingots. Further cost reductions may be achieved by using refined metallurgical grade Si in place of high purity semicondctor or solar-cell grade Si. The lost-cost Si substrate is then modified to allow heteroepitaxial growth of GaAs film with a thickness of a few micrometers.

The first step in modifying the Si substrate is to grow the interlayer. The growth of the Ge or Ge/Si interlayer, and its subsequent recrystallization are important to successful development of GaAs single-crystal solar cells on Si substrates. As noted hereinbefore, lattice misfit is the dominant mechanism for generating various defects in a two-layer system having different lattice parameters and thermal expansion coefficients. However, the lower the processing temperature, particularly for those steps involving the materials growth, the fewer the problems to be expected. Consequently, a CVD system for germane and silane pyrolytic deposition of Ge or Si/Ge alloy films on Si substrates preferably uses high-purity helium (He) as the carrier gas.

During the normal laboratory growth procedure, a graphite susceptor is out-gassed in He at 1000° C. for several hours. Ge epitaxial films on Si with (111) orientation have been obtained at a growth temperature of about 650° C. with He carrier flow rate of 4500 cc/min and an admixture of $GeH_4$/He (5:95) gas at a flow rate of 7.7 cc/min. Growths on (100) Si substrates are also possible. The crystallinity of the Ge layer thus grown on Si was confirmed by Laue back-reflection and transmission as well as by X-ray diffraction.

The Ge or Ge/Si interlayer is then annealed to improve the crystallinity of the surface. During the past few years, the use of laser radiation as a heat source for annealing ion-implantation damage in Si and GaAs has shown dramatic progress. With laser annealing, a higher degree of crystalline perfection than obtained with furnace annealing has been reported in the literature. Among the different schemes used, pulsed laser annealing has been found to give better results in many cases than the use of CW lasers. The pulsed laser method has been reported not only to crystallize an amorphous layer, but also to remove displacement damage and crystal imperfections due to loops and precipitates. It has been shown that defects are eliminated during laser annealing only within the melted silicon layer. This layer recrystallizes after pulse termination with a very rapid growth rate, of the order of $10^2$–$10^3$ cm/s, which exceeds the estimated upper limit of dislocation climb velocity by at least two orders of magnitude. Hence, it is the unusually fast recrystallization velocity achieved during laser annealing that is responsible for achieving improved crystalline perfection to the depth of the melted layer. Pulsed laser annealing is therefore the preferred method to eliminate defects in the Ge or graded Si/Ge interlayer and to produce a nearly perfect crystalline layer of Ge for the subsequent hetero-epitaxial growth of the active GaAs layer in the solar cell structure. A Nd:YAG laser, in the acousto-optical Q-switch pulsed mode was selected for use as an annealing/recrystallization system.

The pulsed laser system preferred is comprised of a Quantronix Model 114-2 Nd:YAG laser (the basic laser unit), a Model 305A spatial mode selector (to allow for single $TEM_{oo}$ mode operation), a Model 317 polarizer/shutter assembly (to linearly polarize the laser beam for improved output stability by eliminating mode competition between randomly polarized modes), a Model 301 Acousto-optical Q-switch system (for pulse mode operation with the pulse repetition rate adjustable from 0–100 kHz), a General Scanning Corp. Model G-100PD mirror scanner with Model CCX-102-1 scanner control unit, a motorized vacuum-tight sample chamber, and the usual optics and pulse-power measuring instrumentation. Eventual scale-up in the sample area, say 10–50 cm$^2$, will require a Nd:glass laser in order to obtain the desired energy density of about 0.5 Joules/cm$^2$ over the entire area. Its wavelength and pulse characteristics are similar to the Nd:YAG laser.

The basic operating mode of the first mentioned laser annealing system involves several steps. The output beam of the pulsed Nd:YAG laser passes through an optical system which focuses the laser beam onto a small area on the sample surface to yield the necessary energy density. The focused beam is deflected by the mirror scanner to form an annealed-line region on the substrate. Simultaneously, the motorized sample chamber continuously translates the substrate in the direction perpendicular to the annealed line. This results in appropriate overlapping between annealed-line regions, until the entire sample surface has been exposed. The advantages of using the combination of mirror scanner and motorized translation stage are elimination of the pincushion distortion of a dual mirror-scanner system, allowance for faster scanning speeds as constrasted to the dual-motorized translation-stage system because of lower inertial mass, and the probability of longer operating lifetime relative to that of the dual-motorized system.

The use of a repetitively Q-switched Nd:YAG or Nd:glass laser in the annealing system is preferred, due to its stability compared to pulsed YAG or ruby lasers. Repeatability is probably the most important laser parameter, because in laser annealing, a carefully controlled temperature distribution must be achieved. Energy densities below a threshold value will not have the desired effect, whereas too high an energy density will cause surface damage. Thus, there is a region of energy densities to be used for optimum laser annealing which can be determined experimentally for a given laser system. After the optimum energy density $I_o$ for laser annealing is experimentally determined, the spot size $D_o$ (diameter of the 1/e power point) can be determined by the following expression:

$$D_o = (4E/\pi I_o)^{\frac{1}{2}},$$

where E is the total energy per laser pulse. In the case of the model 114-2 Quantronix laser, E=1 mJ, and for an upper limit of $I_o = 1$ J cm$^{-2}$, $D_o$ is calculated to be 357 μm. For a 2 cm×2 cm-annealing area, with the Nd:YAG laser operating at 800 pps (the stability of pulse will deteriorate and the energy per pulse will decrease when operating at higher frequencies), and with 50% overlapping for both coordinates during pulse annealing, the scanning frequency for the mirror scanner and the scanning speed for the motorized translating stage are calculated to be 7.1 Hz and 1.27 mm s$^{-1}$, respectively. Hence, it should take only 15.8 seconds to anneal a 2 cm×2 cm-Ge sample. The heating depth (Z) is calculated to be 2 μm with a thermal diffusion time ($t_d$) of 110 ns for Ge at 937° C. Therefore, this requires that $t_d = c\rho Z^2/k$, where $\rho$, c and k are the density, specific heat and thermal conductivity, respectively. For solid Ge, $\rho = 5.2$ gm/cm$^{-3}$, c=0.096 cal gm$^{-1}$K$^{-1}$, and k=0.174 Watt cm$^{-1}$ at 937°, the melting temperature of Ge.

Once the Ge or Ge/Si interlayer has been annealed, a low-cost, high-efficiency GaAs thin-film solar cell is formed with either n+/p shallow homojunctions or Al(Ga)As heteroface p/n junction structures. In each case, the starting substrate and interlayer are p doped for n+/p junctions and n doped for p/n junctions. Although the thin-film solar cell may be formed on the annealed interlayer surface by either CVD using a hydride or halide transport of Ga, it is preferable to do so by organometallic chemical vapor deposition (OM-CVD) because: (1) there is no excessive etching of the low-cost Si substrates or the interlayer by HCl, (2) the growth temperature can be lower with correspondingly lowered auto-doping by diffusion and less detrimental effects because of thermal-expansion mismatch between the GaAs film and substrate, and (3) the use of a single-temperature zone and cold-wall reactor more readily allows for scaling up production and cost reduction.

An n+/p GaAs film was grown on a (100) p+-GaAs substrate. The initial p-layer was grown at 725° C. with a Zn-doping concentration of $4 \times 10^{17}$ cm$^{-3}$ and a thickness of ~2 μm. The subsequent n+-layer was grown at the same temperature with a S-doping concentration of $4 \times 10^{18}$ cm$^{-3}$ and a thickness of ~0.2 μm. The n+/p GaAs film has also been grown on a (100) p+-GaAs substrate which has high residual S concentration. Fabrication of n+/p structures on single-crystal Ge interlayers may use the same growth parameters just described for the single-crystal GaAs substrates. Among the different chemical etchants that may be used prior to GaAs growth are CP4, CP4A, HF:H$_2$O$_2$:H$_2$O:CH$_3$COOH, and HF:HNO$_3$:H$_2$O:CH$_3$COOH (9:4:4:20). The last etch was found to give the best GaAs surface morphology after OM-CVD growth. Using the HF:NHO$_3$:H$_2$O:CH$_3$COOH (9:4:4:20) etch prior to GaAs growth, produced a fairly smooth surface morphology. The other possible etchants produced poorer surface morphology.

For this sample, an initial p$^+$-layer was grown at 700° C. with a Zn-doping concentration of $3 \times 10^{18}$ cm$^{-3}$ and a thickness of ~2 μm, followed by a p-layer grown at 725° C. with a Zn-doping concentration of $2 \times 10^{17}$ cm$^{-3}$ and a thickness of ~2 μm. The final n$^+$-layer was grown at 725° C. with a S-doping concentration of $4 \times 10^{18}$ cm$^{-3}$ and a thickness of ~0.2 μm. Subsequently, n$^+$/p shallow-homojunction solar cells have been made on GaAs epi-layers grown by OM-CVD on single-crystal (100) GaAs substrates.

The GaAs cells were made by sequential growth of ~2 μm-thick p$^+$-layer (p$^+$ = $3 \times 10^{18}$ cm$^{-3}$ Zn-doped), ~2 μm-thick p-layer (p = $2 \times 10^{17}$ cm$^{-3}$ Zn-doped) and ~0.2 μm-thick n$^+$ layer (n$^+$ = $4 \times 10^{18}$ cm$^{-3}$ S-doped) on Zn-doped p$^+$ GaAs (p$^+$ = $4 \times 10^{18}$ cm$^{-3}$) substrates with orientation approximately 2°-off (100) toward (110) plane. The OM-CVD GaAs gowth temperature was 725° C., and an As/Ga mole ratio of 6, arsine mole fraction (MF) of $1.6 \times 10^{-3}$, TMG MF of $9 \times 10^{-4}$, and hydrogen flow rate of 3000 cc/min. were used. In fabricating the n$^+$/p solar cells, a gold back-contact was first deposited by an electroplating method. Subsequently, an AR coating of approximately 1000 Å was produced by anodization. But first, the gold front contact was applied by photolithography and electroplating. Typical energy conversion efficiencies of about 18% were obtained for these solar cells under simulated solar conditions with the best efficiency being 19.3%.

It is noteworthy that obtaining such efficiencies for these cells with areas of 1 cm$^2$ or more requires that the n$^+$ layer be everywhere thicker than the portion of the depletion region in that layer, so as to avoid deleterious shunting effects between the grid metallization and the p-type base layer. One solution to this problem is to grow the n$^+$ layer to a thickness of about one micrometer, then after depositing the grid metallization, stripping to reduce the average thickness of the n$^+$ layer between the grid metallizations to about 500 Å by many successive oxidations and etching steps. However, this procedure imposes stringent requirements on the thickness control of the stripping, is costly and time consuming, and therefore is economically unfavorable for large-scale production. An improved and simpler method which avoids these difficulties is comprised of a p/n or n/p GaAs homojunction and a Ga(Al)As heteroface grown over the GaAs film, as will be described more fully hereinafter.

The OM-CVD process for growing n$^+$/p GaAs structures on single-crystal p-doped GaAs substrates is employed with the process for growing Ge or graded Ge/Si interlayers on Si substrates because of the desirability of using low-cost, single-crystal Si substrates derived from metallurgical grade Si material. This grade of Si is invariably p-type because it contains excess amounts of boron and aluminum. Thus, it is necessary that the GaAs cell formed on it should have a p-type base layer. It is also desirable to deposit the Ge or Ge/Si interlayer on the Si as a p-type single-crystal. As noted hereinbefore, the interlayer is grown before the GaAs structure for improved lattice and thermal expansion coefficient matching between the Si substrate and the GaAs structure.

Fabrication of n$^+$/p GaAs structures on single-crystal p-doped Ge (100) substrates may be by the same growth parameters first described for the single-crystal GaAs substrates. However, very poor surface morphology and leaky diode characteristics were observed on a few n$^+$/p GaAs/Ge structures. The leaky diode performance may have been caused by the poor surface morphology resulting in a shunted junction after electroplating the conducting grid contact on the top surface. Some portions of the top n$^+$-layer might have been completely removed during thinning arising from the anodization process in producing the 1000 Å-thick antireflection coating. Another possible cause could be auto-doping from the Ge. To resolve the problems associated with the n$^+$/p GaAs/Ge structure, a study of the properties of GaAs grown on Ge (100) substrates using different surface treatment and growth conditions was undertaken. Among the different chemical etchant that have been used were CP4, CP4A, HF:H$_2$O$_2$:CH$_3$OOH, and HF:HNO$_3$:H$_2$:CH$_3$COOH (9:4:4:20). The last etchant was found to give the best GaAs surface morphology after OM-CVD growth. Using the HF:HNO$_3$:H$_2$O:CH$_3$COOH (9:4:4:20) etchant prior to GaAs growth has shown a fairly smooth surface morphology.

The surface morphology of GaAs grown on Ge was also found to be strongly influenced by the growth temperature. Smooth GaAs layers on Ge substrates were obtained at growth temperatures of 700° C. or higher. However, auto-doping by Ge from the substrate at 700° C. was excessive. At 625° C. growth temperature, for which Ge auto-doping was not observed, poor surface morphology was invariably obtained, indicating that this temperature was too low for hetero-epitaxial growth of GaAs on (100) Ge. In order to improve the surface morphology and yet to avoid high auto-doping, a method using sequential GaAs growths at two temperatures, a higher one for initial nucleation and a lower one for continued growth gives good results for the energy conversion efficiency.

Some of the difficulties associated with the n$^+$/p shallow homojunction structure are that the depletion width in the n$^+$ layer must be everywhere less than the thickness of that layer (about 500 Å). In addition, trade-offs between light absorption and sheet resistance in the n$^+$ layer are also rather stringent. Fortunately, peak open circuit voltages of about one volt are obtainable in GaAs homojunctions, even for doping levels as low as the $10^{17}$ cm$^3$ range. However, the upper limit for doping donor impurities, about $5 \times 10^{18}$ cm$^{-3}$, is marginal in such n$^+$/p structures for keeping low enough the series resistance due to sheet resistivity of the n$^+$ layer.

If the source material cost of polycrystalline Si can be reduced sufficiently, then n-type Si substrates would become available for use so as to meet the long-term, mass-production photovoltaic cost goals. This would be the case if solar cells were developed to have an encapsulated Air Mass 1 cell efficiency of greater than 17–18%. With n-type Si substrates, it is possible to fabricate a Ga(Al)As/GaAs heteroface cell in which the homojunction is p/n, without the need for a very thin top layer (emitter), thus avoiding the fabrication difficulties described earlier for the n$^+$/p structure.

In order to generate such a heteroface structure, the OM-CVD process is modified by adding a trimethyl aluminum (TMA) source. For this structure, the metallization scheme for the grid electrode will, of course, be different from the n+/p structure.

It should now be apparent that a new and improved method has been disclosed for producing a thin-film GaAs crystal for a solar cell on a single-crystal silicon substrate having a single-crystal interlayer which more closely matches the single-crystal GaAs in lattice and thermal expansion characteristics. Although particular embodiments have been described by way of example, and not limitation, it is recognized that modifications and variations may readily occur to those skilled in the art, particularly in the selection of materials. Consequently, it is intended that the claims be interpreted to cover such modifications and variations.

What is claimed is:

1. A method for producing a thin-film GaAs single crystal layer for a solar cell structure on a single-crystal silicon substrate comprising the steps of growing on said silicon substrate a single-crystal interlayer of semiconductor material having a closer match in lattice and thermal expansion with single-crystal GaAs than the single-crystal silicon of said substrate, and annealing by pulsed beams of energy only the top of said interlayer of material for recrystallization prior to growing said thin-film GaAs single crystal layer, thereby achieving surface recrystallization to just about a micrometer depth, and epitaxially growing said single-crystal film of GaAs on said annealed interlayer for said solar cell structure.

2. A method as defined in claim 1 wherein said material of said interlayer is germanium.

3. A method as defined in claim 1 or 2 wherein said single-crystal film of GaAs is grown as a single-crystal n+/p shallow homojunction film on said interlayer.

4. A method as defined in claim 1 or 2 wherein said single-crystal film of GaAs is grown as a p/n or n/p junction film and further comprising the step of growing a Ga(Al)As heteroface film over said GaAs film.

5. A method for producing a thin-film GaAs single crystal layer for a solar cell structure on a single-crystal silicon substrate comprising the steps of growing on said silicon substrate semiconductor material having a closer match in lattice and thermal expansion with single-crystal GaAs than the single-crystal silicon of said substrate, and epitaxially growing a single-crystal film of GaAs on said interlayer for said GaAs solar cell structure, said material of said interlayer being step graded germanium-silicon alloy, with low germanium content at the silicon substrate interface, and high germanium content at the upper surface.

6. A solar cell comprised of a single crystal silicon substrate, a single-crystal interlayer, and a single-crystal GaAs film epitaxially grown on said interlayer, said interlayer being comprised of epitaxial single-crystal semiconductor material having a closer match in lattice and thermal expansion with single-crystal GaAs than with the single-crystal silicon of said substrate, a back contact on said substrate and a grid contact on said film said interlayer being comprised of step graded germanium-silicon alloy, with low germanium content at the silicon substrate interface, and a high germanium content at the upper surface.

7. A solar cell as defined in claim 6 wherein said GaAs film is an n+/p shallow homojunction film.

8. A solar cell as defined in claim 6 wherein said GaAs film is an n/p or p/n junction film, and further comprising a Ga(Al)As heteroface film on said junction film.

* * * * *